PARAMETRIC AMPLIFIER COMBINING SIGNAL AND IDLER OUTPUTS
Filed Aug. 30, 1967
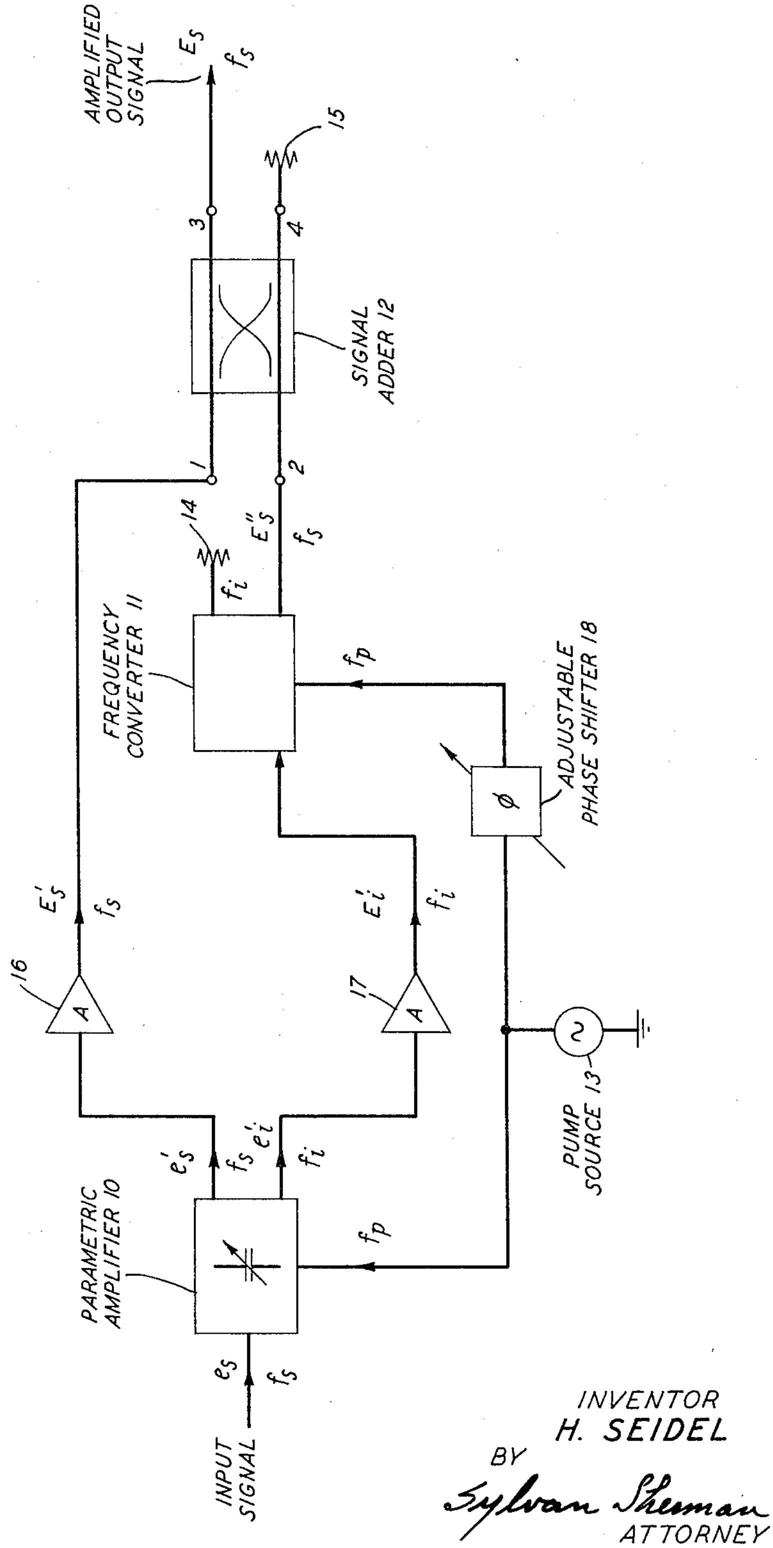
INVENTOR
H. SEIDEL
BY
Sylvan Sherman
ATTORNEY 3,381,233

PARAMETRIC AMPLIFIER COMBINING SIGNAL AND IDLER OUTPUTS

Harold Seidel, Warren Township, Somerset County, N.J., assignor to Bell Telephone Laboratories, Incorporated, Murray Hill, N.J., a corporation of New York
Filed Aug. 30, 1967, Ser. No. 664,353
6 Claims. (Cl. 330—4.5)

ABSTRACT OF THE DISCLOSURE

A signal amplifier combining both signal and idler frequencies of a parametric amplifier. The idler is frequency converted to the signal using the common pump frequency means.

In accordance with the invention, the idler wave generated by the parametric amplifier stage is preserved along with the amplified signal wave. The idler wave is then converted to the signal wave frequency by the frequency converter. The two signal waves are then combined, in phase, to produce the amplified output signal.

The resulting amplifier is characterized by an extended dynamic range of the order of 6 db, and a 3 db reduction in uncorrelated noise.

This invention relates to a parametric amplifier arrangement having an improved noise figure and greater dynamic range.

*Background of the invention*

The parametric amplifier and, in particular, the varactor diode parametric amplifier has been successfully utilized as a microwave amplifier. More recently, parametric interaction has been applied at optical frequencies to produce a light amplifier.

*Summary of the invention*

It is the object of the present invention to utilize the unique properties of parametric devices as a means of improving the dynamic range and noise performance of parametric amplifiers. In particular, it is proposed to make use of the fact that the signal wave and the idler wave of a parametric amplifier are totally correlated, whereas a portion of the internal noise associated with the idler and signal circuits, and the noise associated with secondary amplifiers located in the idler and signal wavepaths, are uncorrelated. Accordingly, an amplifier, in accordance with the present invention, preserves the idler wave generated in a parametric amplifier along with the amplified signal wave. The idler wave is then reconverted to the signal wave frequency by means of a frequency converter which is pumped by the same pump source as the amplifier. The two signal waves are then combined, in phase, to produce the amplified output signal.

The resulting amplifier has an extended dynamic range of the order of 6 db, and a 3 db reduction in uncorrelated noise.

These and other objects and advantages, the nature of the present invention, and its various features, will appear more fully upon consideration of the illustrative embodiment now to be described in detail in connection with the accompanying drawing which shows an amplifier including a parametric amplifier stage and a frequency converter.

In the drawing there is shown an amplifier circuit, in accordance with the invention, including a parametric amplifier stage 10, a frequency converter 11 and a signal adder circuit 12.

Frequency converter 11 can be either a resistive frequency converter or a reactive (parametric) frequency converter. Which one of these two general types of converter is used will depend, among other considerations, upon the ratio of the output frequency to the input frequency. For example, where up-conversion is required, a parametric converter is advantageously used inasmuch as there is a conversion gain associated with a parametric up-converter which is a function of the above-noted frequency ratio. In a down-converter, however, this ratio is less than unity. Accordingly, where down-conversion is required, a resistive down-converter is advantageously used inasmuch as the conversion loss in a resistive converter is independent of the frequency ratio.

Parametric amplifier 10 and, where appropriate, parametric converter 11 can be any one of the numerous types of parametric devices known in the art. For a description of one type of parametric device, utilizing a variable capacitance diode as the active element, see the article by E. D. Reed entitled "The Variable-Capacitance Parametric Amplifier," published in the October 1959 issue of the Bell Telephone Record, vol. 37, No. 10, pp. 373–379. A second type of parametric device, using gyromagnetic materials as active elements, is illustrated in United States Patents 2,978,649 and 3,218,564.

Regardless of the circuit specifics, each parametric device utilizes a nonlinear reactive element as a means of coupling energy between two or more alternating current signals. Depending upon the frequency relationships among the several signals, such devices are referred to as frequency multipliers, frequency dividers, amplifiers, or frequency converters, which include both up-converters and down-converters. The present invention employs a parametric amplifier and a frequency converter which, depending upon the frequency choice in the amplifier, can be either an up-converter or a down-converter.

As is known, in parametric amplifier, wave energy at the signal frequency $f_s$ is coupled to the amplifier along with a pumping signal at a frequency $f_p$ greater than $f_s$. The resulting interaction produces an idler signal at the difference frequency $f_i=f_p-f_s$. In a parametric amplifier, the idler signal is typically dissipated locally in the idler circuit, while amplified wave energy at the signal frequency is extracted from the amplifier. In a frequency converter, on the other hand, the wave energy at the input frequency is dissipated, while wave energy at the difference frequency is extracted. If the difference frequency is larger than the input signal frequency, the converter is an up-converter. If the difference frequency is less than that of the input signal frequency, the converter is a down-converter.

In accordance with the present invention, both amplifier 10 and converter 11 are pumped at a frequency $f_p$ by means of a common pump source 13. For reasons which will be explained hereinbelow, an adjustable phase shifter 18 is included in one of the wavepaths connecting the pump source and one of the parametric devices 10 or 11. For purposes of illustration, phase shifter 18 is included between pump source 13 and converter 11.

Simultaneously, with the application of pump wave energy, an input signal $e_s$, at signal frequency $f_s$, is coupled to amplifier 10, wherein it is amplified to produce an output signal $e_s'$, and wherein an idler wave $e_i'$, at the difference frequency $f_i=f_p-f_s$, is also generated. Typically, as noted hereinabove, the idler wave would be dissipated locally within the amplifier. In accordance with the present invention, however, the idler wave $e_i'$ is preserved and extracted from amplifier 10 along with the signal wave. Advantageously, the idler wave is amplified by means of an amplifier 17, and then coupled to frequency converter 11 to produce a second signal wave $E_s''$ at the signal frequency $f_s$. The signal wave derived from converter 11 is coupled to the signal adder, whereas wave energy at the idler frequency is dissipated, as indicated by the resistive termination 14.

Signal wave $e_s'$ derived from amplifier 10 is also advantageously amplified by means of an amplifier 16, and the amplified signal $E_s'$ coupled to adder 12 wherein the two signals, $E_s'$ and $E_s''$, are combined, in phase, to produce the amplified output signal $E_s$.

The advantages to be realized by the above-described amplifier arrangement result from the unique relationship between the idler wave and the signal wave in a parametric device. Specifically, the signal wave $e_s'$ and the idler wave $E_i'$, produced in amplifier 10, are totally correlated. Accordingly, by preserving the idler wave and using it to generate a second signal wave in a manner to preserve this correlation, makes it possible to combine these two signal waves $E_s'$ and $E_s''$ in phase. The result is a four-fold increase in the useful output power which represents a 6 db increase in the dynamic range of a typical parametric amplifier before saturation. Since there are generally gain-bandwidth limitations in a parametric amplifier, this gain can, alternatively be traded for bandwidth. Thus, for example, the gain of amplifier 10 can be reduced by 6 db, yielding the same net overall gain as a simple parametric amplifier, but with a correspondingly significant increase in bandwidth.

In addition to the improvement in dynamic range, there is also a significant improvement in the noise performance of the above-described amplifier, over that obtainable in the more conventional parametric amplifier. Noise typically derives from within the parametric amplifier itself and from other, independent, secondary amplifiers that usually follow the parametric amplifier. The improvements referred to result from the fact that a portion of the internally generated noise associated with the signal and idler circuits is uncorrelated, as is the noise associated with secondary stage amplifiers 16 and 17. Consequently, whereas the totally correlated signals $E_s'$ and $E_s''$ combine in phase in adder 12, to produce a four-fold increase in signal power, the uncorrelated noise power merely doubles. Thus, there is a 3 db reduction in secondary stage noise and a 3 db reduction in uncorrelated, internally generated, noise.

As indicated above, an adjustable phase shifter 18 is included in the wavepath connecting the pump source to converter 11. It is the function of this phase shifter to permit adjustment of the relative phase between the two signals $E_s'$ and $E_s''$ in order that they can be combined, in phase, in adder 12. For example, if a quadrature hybrid junction is used to combine the two signals, the phase shifter is adjusted so that signal $E_s''$ is 90 degrees out of phase with respect to signal $E_s'$ in order for these two signals to combine in phase in a common branch of the hybrid. If, on the other hand, a 180 degree hybrid junction is used, signal $E_s''$ is adjusted to be either in phase, or 180 degrees out of phase with signal $E_s'$.

It is recognized that phase shifter 18 can, alternatively, be located in the wavepath connecting pump source 13 to amplifier 10, or in the idler wavepath, or in either of the signal wavepaths.

Advantageously, the gain of each of the amplifiers 16 and 17 is adjusted such that the two signals $E_s''$ and $E_s'$ are equal in amplitude. If they are, a 3 db hybrid is used as the signal adder. If, on the other hand, these two signals are unequal, a hybrid junction having another power division ratio, appropriate under the circumstances, must be used.

In the embodiment illustrated, the signal adder is depicted as a directional coupler with signal $E_s'$ coupled to branch 1 and signal $E_s''$ coupled to conjugate branch 2. The output signal is derived from branch 3, whereas branch 4 is resistively terminated by means of a resistor 15.

In the above discussion, parametric devices adapted to handle electromagnetic signals were referred to. It is understood, however, that the principles of the invention can be applied to an amplifier adapted to amplify other types of wave energy such as, for example, elastic waves. Thus, in all cases it is understood that the above-described arrangement is illustrative of but one of the many possible specific embodiments which can represent applications of the principles of the invention. Numerous and varied other arrangements can readily be devised in accordance with these principles by those skilled in the art without departing from the spirit and scope of the invention.

What is claimed is:

1. In combination:

- a parametric amplifier and a frequency converter;
- means comprising a common pump source for supplying pumping wave energy to said amplifier and to said converter;
- means for coupling an input signal to said amplifier;
- means for extracting signal wave energy from said amplifier;
- means for extracting idler wave energy from said amplifier;
- means for coupling said idler wave energy from said amplifier to said converter;
- means for extracting signal wave energy from said converter;
- and means for combining in phase, the signal wave energy extracted from said amplifier and from said converter.

2. The combination according to claim 1 including an adjustable phase shifter for adjusting the relative phase between the signals extracted from said amplifier and from said converter.

3. The combination according to claim 1 including separate means for amplifying the signal wave energy and the idler wave energy extracted from said amplifier.

4. The combination according to claim 1 wherein said signals are combined in a hybrid junction.

5. The combination according to claim 1 wherein said converter is a parametric converter.

6. The combination according to claim 1 wherein said converter is a resistive converter.

References Cited

UNITED STATES PATENTS

| | | | |
|---|---|---|---|
| 3,181,078 | 4/1965 | La Rosa | 330—4.6 |
| 3,237,017 | 2/1966 | Maurer et al. | 330—4.9 |
| 3,341,783 | 9/1967 | Roulston | 330—4.5 |

ROY LAKE, *Primary Examiner.*

DARWIN HOSTETTER, *Examiner.*